United States Patent [19]

Perkins

[11] Patent Number: 4,646,033

[45] Date of Patent: Feb. 24, 1987

[54] CRYSTAL CONTROLLED OSCILLATOR

[75] Inventor: Goeffrey W. Perkins, Chandler, Ariz.

[73] Assignee: Motorola, Inc., Schaumburg, Ill.

[21] Appl. No.: 847,414

[22] Filed: Apr. 3, 1986

[51] Int. Cl.[4] .............................................. H03B 5/36
[52] U.S. Cl. ................................ 331/116 R; 331/158; 331/177 R
[58] Field of Search ............ 331/116 R, 116 FE, 158, 331/159, 177 R, 117 R

[56] References Cited

U.S. PATENT DOCUMENTS 4,571,558 2/1986 Gay et al. ................... 331/116 R X

Primary Examiner—Siegfried H. Grimm
Attorney, Agent, or Firm—Michael D. Bingham

[57] ABSTRACT

A VCO including an oscillation sustaining feedback loop for maintaining the phase shift between the output and the input of a first amplifier to sustain oscillations. A diversion gate coupled with the input of the first amplifier causes the frequency of oscillation to be adjusted by introducing a phase shift within the feedback loop to thereby force the resonant frequency of a crystal connected to the input of the first amplifier to change accordingly. The feedback loop comprises a first integrator connected to the output of the first amplifier, a second amplifier having an input coupled to the output of the first amplifier and an output coupled to the input of the first amplifier and a second integrator connected to the output of the second amplifier with the output of the diversion gate being connected to the output of the second amplifier.

11 Claims, 2 Drawing Figures

CRYSTAL CONTROLLED OSCILLATOR

BACKGROUND OF THE INVENTION

The present invention relates to oscillators and, more particularly, to a crystal controllable oscillator.

Crystal controlled oscillators that are suited to be manufactured in monolithic integrated circuit form and operated as voltage controlled oscillators (VCO's) are well known to those skilled in thee art. For instance, U.S. Pat. No. 4,571,558 describes such an oscillator. The oscillator circuit disclosed in the '558 patent requires only one additional external pinout from the integrated circuit for connection to an external crystal resonator network. This oscillator includes an oscillation sustaining feedback loop comprising a pair of integrators connected between the output of a differential amplifier and an input thereof for introducing the correct phase shift therebetween to maintain oscillation.

Based on the prior art there is a need for an improved integrated crystal controlled oscillator having a simplified structure to increase manufacturing yields to decrease production costs as well as having improved frequency stability and the ability to drive emitter-coupled-logic loads.

SUMMARY OF THE INVENTION

Accordingly, it is an object of the present invention to provide an improved oscillator circuit.

It is another object of the present invention to provide an improved crystal controlled oscillator.

Still another object of the invention is to provide an improved voltage controlled oscillator.

Yet another object of the present invention is to provide an improved voltage controlled crystal oscillator suitable to be fabricated in integrated circuit form and to drive emitter-coupled-logic loads.

In accordance with the above and other objects there is provided a crystal controlled oscillator comprising a first amplifier having an input that is coupled to a crystal resonator and an output, and an oscillation sustaining feedback loop coupled between the output and input of the first amplifier, the feedback loop including a first integrator connected to the output of the first amplifier, a second amplifier having an input coupled to the output of the first amplifier and an output, a second integrator connected to the output of the second amplifier and circuitry for coupling the output of the second amplifier to the input of the first amplifier.

A feature of the oscillator is that a frequency adjusting circuit is connected to the output of the second amplifier which introduces variable phase shift within the feedback loop to force the frequency of the crystal to change thereby permitting the oscillator to be operated as a VCO.

DETAILED DESCRIPTION OF THE INVENTION

Figure 1:
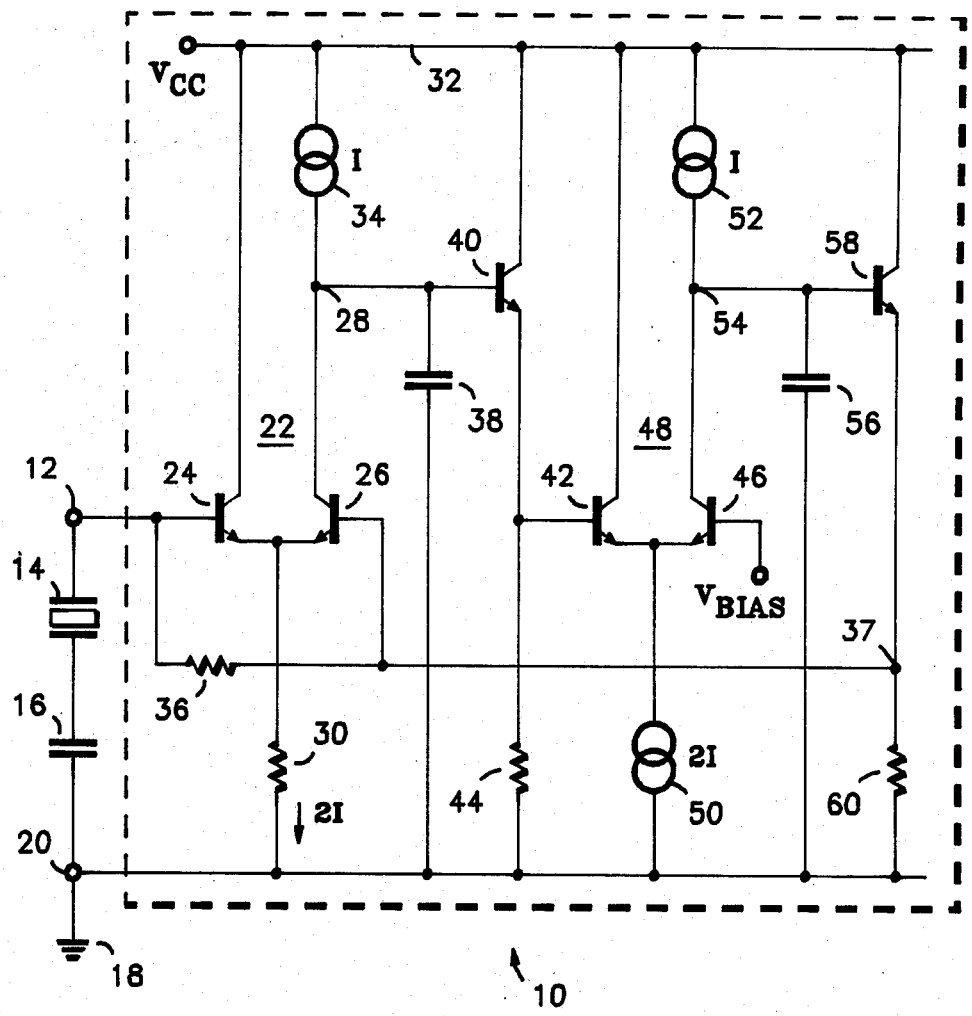
FIG. 1 is a schematic diagram illustrating the basic oscillator of the present invention.

Turning to FIG. 1 there is illustrated basic crystal controlled oscillator 10 of the present invention which, as shown by dashed outline, is suited to be fabricated in monolithic integrated circuit form. Oscillator 10 requires only one additional external terminal 12 to which is coupled crystal 14. Crystal 14 is connected in series with capacitor 16 to earth ground 18 at terminal 20.

A first amplifier 22 comprising differentially connected transistors 24 and 26 has an input (the base of transistor 24) coupled to crystal 14 and an output coupled to node 28. The emitters of transistors 24 and 26 are connected through resistor 30 to earth potential 18. The collector of transistor 24 is directly connected to power supply conductor 32 to which is applied operating potential Vcc while a current I is supplied to the collector of transistor 26 from current source 34. The base of transistor 26 is coupled via resistor 36 to the base of transistor 24 and terminal 12 and is directly coupled to node 37.

A first integrator comprising capacitor 38 is coupled at output 28 of amplifier 22 to earth potential 18 which, in conjunction with the high impedance output of transistor 26, introduces a ninety degree lag in the phase of the voltage appearing at the output of amplifier 22. This voltage signal is supplied to the base of emitter follower transistor 40 and appears at the base of transistor 42, across resistor 44, without any phase shift introduced thereto.

Transistor 42 is connected differentially with transistor 46 thereby forming a second differential amplifier 48. The emitters of transistors 42 and 46 are connected via constant current source 50 to earth potential 18. The collector of transistor 42 is directly coupled to power supply conductor 32 whereas the collector of transistor 46 is coupled thereto via current source 52. Differential amplifier 48 functions as a second amplifier the input of which corresponds to the base of transistor 42. An output of amplifier 48 is supplied at node 54 at the collector of transistor 46. A direct current (dc) bias voltage, Vbias, is supplied to the base of transistor 46.

A second integrator comprising capacitor 56 is coupled between output node 54 and earth potential 18 which, in conjunction with the high collector impedance of transistor 46, produces a ninety degree lag in the phase of the voltage developed thereacross. This voltage is applied to the base of emitter follower transistor 58 to node 37 and via resistor 60 to earth potential 18. Node 37 is connected through resistor 36 to the base of transistor 24. The connection from the output of amplifier 22 through amplifier 48 back to the input of the former and which includes the integrators 38 and 56 provides an oscillation sustaining feedback loop as will be more fully explained below.

For explanation purposes it will be asssumed that oscillator 10 is in a quiescent oscillating state. Further, it is assumed that the phase of the oscillating signal appearing at node 37 is at zero degrees. In order to sustain oscillations the feedback loop must provide positive feedback from node 37 through amplifiers 22 and 48 via emitter follower transistors 40 and 58 back to node 37 whereby the signal appearing at the emitter of transistor 58 has zero phase. In the quiescient oscillating condition oscillator 10 will oscillate at the resonant frequency of crystal 14. In this state, crystal 14 and capacitor 16 provide a short circuit to earth potential of any oscillation signals appearing at the base of transistor 24. Thus, any voltage developed across resistor 60 at the oscillation frequency is inverted through transistor 26 and appears at output node 28 at a phase of 180 degrees out of phase with respect to the oscillation signal established at node 37.

Integrator capacitor 38 produces a voltage thereacross that lags the phase of the voltage produced at the collector of transistor 26 by ninety degrees, hence, at phase of positive ninety degrees with respect to the voltage signal developed at node 37. Emitter follower transistor 40 level shifts the voltage applied to the base thereof and provides a voltage across resistor 44 that has the same phase as the voltage developed across capacitor 38. Therefore the voltage supplied to the base of transistor 42 has a phase that is at a positive ninety degrees with respect to the voltage at node 37.

The voltage produced at the collector of transistor 46 is in phase with the voltage supplied to the base of transistor 42. A voltage is developed across capacitor 56 that lags the phase of the voltage at collector of transistor 46 by ninety degrees and is therefore in phase with the voltage signal developed at node 37. Emitter follower transistor 58 voltage level shifts the voltage supplied to its base to provide a voltage at node 37 that is in phase with the assumed oscillating signal. Thus, oscillation will be maintained by oscillator 10 at the resonant frequency of crystal 14 as the feedback loop provides 360 degrees of phase shift about the loop.

Negative DC feedback is utilized to set the quiescent voltage level at the emitter of transistor 58 to Vbias by setting all of the bases of transistors 24, 26, 42 and 46 to the same voltage. If the voltage at the base of transistor 46 should increase the negative feedback loop causes the potential at the base of transistor 58 to decrease. This produces a corresponding decrease in the potential at node 37 and at the bases of transistors 24 and 26. Subsequently the voltage at the base of transistor 40 will increase thereby increasing the voltage applied at the base of transistor 42 until the latter balances the increase in the bias potential at the base of transistor 46. The negative DC feedback loop therefore sets the DC operating condition of oscillator 10. By setting the current flow through resistor 30 to a value of 2I all of the bases of transistors 24, 26, 42 and 46 are set to the voltage, Vbias.

Figure 2:
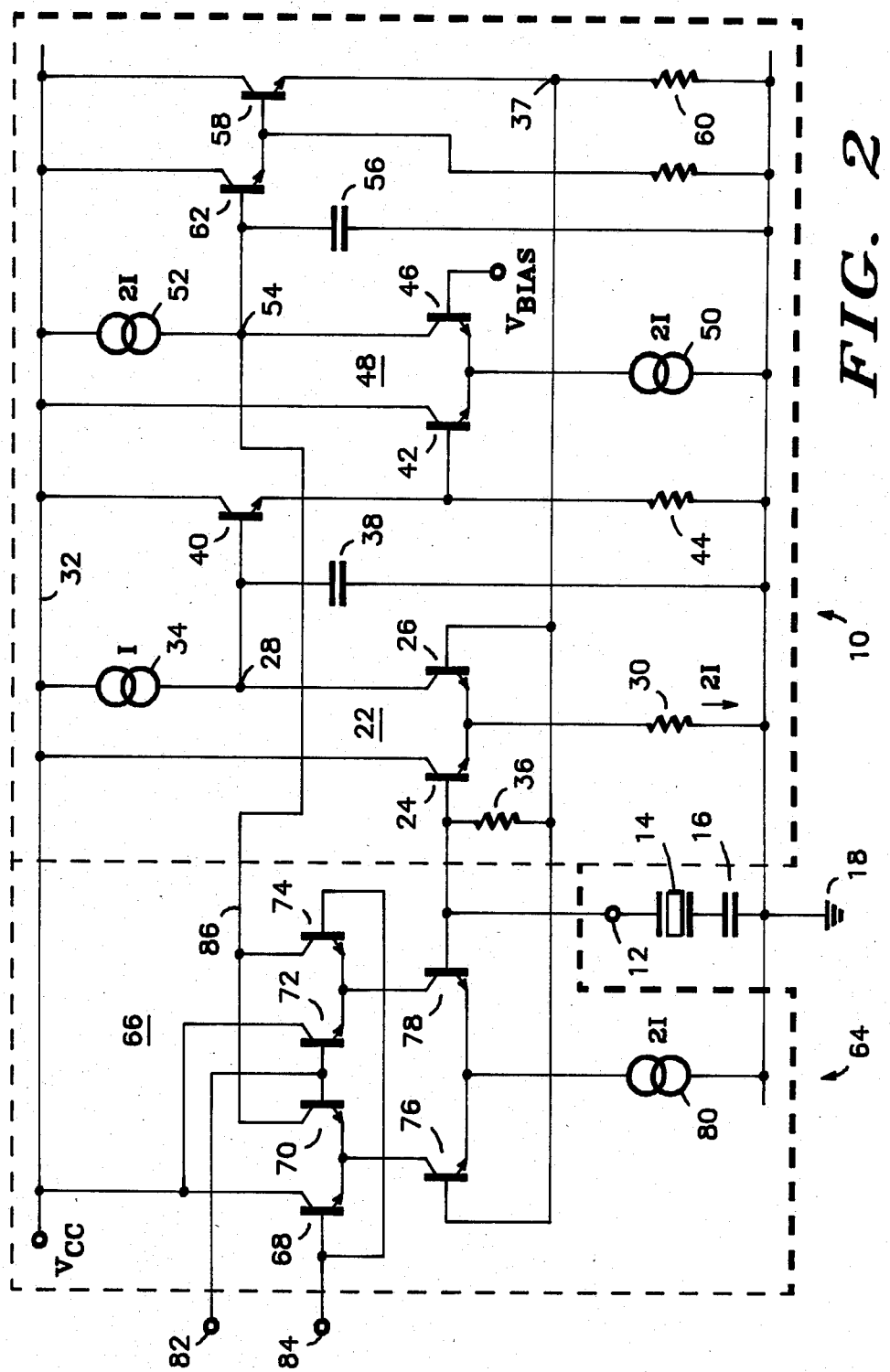
FIG. 2 is a schematic diagram illustrating the crystal controlled oscillator of the preferred embodiment.

As described above oscillator 10 operates at the fixed resonant frequency of crystal 14. Oscillator 10 may be used as a voltage controlled oscillator (VCO) by introducing a variable portion of the oscillation signal in quadrature to the main signal path to force the crystal to shift frequency as will now be described below with reference to FIG. 2. It is understood that components of VCO 64 illustrated in FIG. 2 corresponding to like components of oscillator 10 of FIG. 1 are designated by the same reference numbers.

VCO 64 is illustrated as comprising oscillator 10 as described above. In addition VCO 64 includes diversion gate circuit 66 formed by interconnected transistors 68, 70, 72 and 74 which add a signal in quadrature to the oscillating signal generated at the collector of transistor 46. A differential amplifier comprising transistors 76 and 78 the emitters of which are differentially connected to current source 80 supplies voltages signals 180 degrees out of phase with respect to one another at the collectors thereof to the respective interconnected emitters of transistors 68,70 and 72,74. The bases of transistors 76 and 78 are coupled respectively to the bases of transistors 24 and 26.

A VCO control voltage is supplied across terminals 82 and 84 to the bases of transistors 70,72 and 68,74 respectively. By controlling the VCO control voltage the phase of the signal steered via lead 86 to the collector of transistor 46 can be shifted along the 0 to 180 degree axis.

For example, as transistors 68 and 74 are rendered conductive, a signal is produced at the collector of transistor 74 which is steered through transistor 78, which is in phase with the oscillation signal appearing at node 37. This signal is phase shifted by capacitor 56 by ninety degrees to have a phase that is at a +90 degrees with respect to the voltage signal produced at collector of transistor 46 via amplifier 22 as described for FIG. 1. These two voltage signals are vectorially summed to produced a resultant signal that has a phase of +45 degrees. This summed signal is supplied to the base of transistor 62 connected in a Darlington configuration with transistor 58 and supplied to node 37 without introduction of additional phase shift thereto. Since the total phase shift through the feedback loop is no longer 360 degrees but instead has been varied by gate 66, crystal 14 is forced to change frequency until the phase of the voltage at the collector of transistor 46 is made equal to the phase of the voltage signal developed across resistor 60. Similarly, turning on transistor 70 by controlling the VCO control signal steers a signal through this transistor via transistor 76 to produce a voltage signal on lead 86 that is 180 degrees out of phase with respect to the oscillation signal appearing at node 37. This signal is phase shifted by capacitor 56 such that it is at a phase of −90 degrees with respect to the voltage signal produced at the collector of transistor 46. A resultant signal is therefore produced across capacitor 56 that has a phase of −45 degrees which again forces crystal 14 to change frequency. Thus, by steering a portion of the signal applied to diversion gate 66 from node 37 the feedback loop introduces a phase shift therethrough that forces the resonant frequency of crystal 14 to shift in order to sustain oscillation.

Thus, what has been described above is a novel oscillator suited to be utilized as a VCO which includes a pair of integrators within the oscillation sustaining feedback loop.

I claim:
1. A crystal controlled oscillator, comprising:
a first amplifier having an input to which is coupled a crystal resonator and an output; and
an oscillation sustaining feedback loop coupled between said output and input of said first amplifier means for sustaining oscillations of the oscillator, said feedback loop including first integrator means coupled to said output of said first amplifier, a second amplifier having an input and an output, means coupling said input of said second amplifier to said output of said first amplifier, second integrator means coupled to said output of said second amplifier, and means for coupling said output of said second amplifier to said input of said first amplifier.

2. The oscillator of claim 1 wherein:
said first amplifier comprises a differential amplifier having first and second inputs and an output, said first input and output being said input and output of said first amplifier respectively and resistive means coupling said first input both to said feedback loop and said second input; and
said second amplifier comprises a second differential amplifier having first and second inputs and an output, said first input and said output being said input and output respectively of said second amplifier and means for coupling said second input to a bias potential.

3. The oscillator of claim 2 including means for adjusting the frequency of oscillation of the oscillator.

4. The oscillator of claim 3 wherein:
said first integrator means comprises a first capacitor connected between said output of said first amplifier and a first power supply conductor to which is supplied a ground reference potential; and
said second integrator means comprises a second capacitor connected between said output of said second amplifier and said first power supply conductor.

5. The oscillator of claim 4 wherein:
said means for coupling said input of said second amplifier to said output of said first amplifier includes a first emitter follower configured transistor; and
said means for coupling said output of said second amplifier to said input of said first amplifier includes a second emitter follower configured transistor.

6. The oscillator of claim 5 wherein said means for adjusting the frequency of oscillation includes gate means having an output coupled to said second integrator means and an input coupled to said feedback loop, said gate means being responsive to a control voltage applied thereto for causing the loop phase shift of the feedback loop to be varied accordingly to thereby force a change in the frequency of operation of said crystal resonator.

7. The oscillator of claim 6 wherein said gate means includes:
a third differential amplifier having first and second inputs and ouputs, said first and second inputs being coupled respectively to said first and second inputs of said first differential amplifier; and
steering circuit means coupled to said first and second outputs of said third differential amplifier for providing a signal at said output of said gate means having a phase that is controllable.

8. The oscillator of claim 7 wherein said steering circuit means includes:
first and second transistors the emitters of which are interconnected to said first output of said third differential amplifier; and
third and fourth transistors the emitters of which are interconnected to said second output of said third differential amplifier, the bases of said second and third transistors being interconnected, the bases of said first and fourth transistors being interconnected with said control voltage being applied across said interconnected bases of said first, second, third and fourth transistors, the collectors of said first and third transistors being interconnected to a second power supply conductor to which is supplied an operating potential and the collectors of said second and fourth transistors being interconnected to said output of said gate means.

9. The oscillator of claim 3 wherein said means for adjusting the frequency of oscillation includes gate means having an output coupled to said second integrator means and an input coupled to said feedback loop, said gate means being responsive to a control voltage applied thereto for causing the loop phase shift of the feedback loop to be varied accordingly to thereby force a change in the frequency of operation of said crystal resonator.

10. The oscillator of claim 9 wherein said gate means includes:
a third differential amplifier having first and second inputs and ouputs, said first and second inputs being coupled respectively to said first and second inputs of said first differential amplifier; and
steering circuit means coupled to said first and second outputs of said third differential amplifier for providing a signal at said output of said gate means having a phase that is controllable.

11. The oscillator of claim 10 wherein said steering circuit means includes:
first and second transistors the emitters of which are interconnected to the first output of said third differential amplifier; and
third and fourth transistors the emitters of which are interconnected to said second output of said third differential amplifier, the bases of said second and third transistors being interconnected, the bases of said first and fourth transistors being interconnected with said control voltage being applied across said interconnected bases of said first, second, third and fourth transistors, the collectors of said first and third transistors being interconnected to a power supply conductor to which is supplied an operating potential and the collectors of said second and fourth transistors being interconnected to said output of said gate means.

* * * * *